United States Patent
Jang et al.

(10) Patent No.: US 7,880,714 B2
(45) Date of Patent: Feb. 1, 2011

(54) SHIFT REGISTER AND METHOD FOR DRIVING THE SAME

(75) Inventors: Young Ho Jang, Gyeonggi-do (KR); Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1312 days.

(21) Appl. No.: 11/289,384

(22) Filed: Nov. 30, 2005

(65) Prior Publication Data
US 2006/0238482 A1 Oct. 26, 2006

(30) Foreign Application Priority Data
Apr. 22, 2005 (KR) .................... 10-2005-0033589

(51) Int. Cl.
*G09G 3/36* (2006.01)
(52) U.S. Cl. ...................... 345/100; 345/87
(58) Field of Classification Search ........... 345/87–103
See application file for complete search history.

(56) References Cited

U.S. PATENT DOCUMENTS

| | | | |
|---|---|---|---|
| 5,859,630 A * | 1/1999 | Huq | 345/100 |
| 6,300,928 B1 * | 10/2001 | Kim | 345/92 |
| 6,919,875 B2 * | 7/2005 | Abe et al. | 345/100 |
| 7,106,292 B2 * | 9/2006 | Moon | 345/100 |
| 7,289,096 B2 * | 10/2007 | Jeon et al. | 345/100 |
| 7,382,348 B2 * | 6/2008 | Kim et al. | 345/100 |
| 2003/0210220 A1 * | 11/2003 | Hebiguchi | 345/100 |
| 2005/0083292 A1 * | 4/2005 | Moon et al. | 345/100 |
| 2005/0104836 A1 * | 5/2005 | Lin et al. | 345/98 |

* cited by examiner

*Primary Examiner*—Alexander Eisen
*Assistant Examiner*—Nelson Lam
(74) *Attorney, Agent, or Firm*—Birch Stewart Kolasch & Birch, LLP

(57) ABSTRACT

A shift register and a method for driving the same are disclosed. The shift register includes a plurality of stages serially connected to each other. Each of the stages independently generates first and second scan pulses. The first scan pulse is simultaneously applied to a previous stage and to a corresponding gate line of a liquid crystal panel. The second scan pulse is applied to a next stage. The shift register prevents scan pulses applied to each stage from being distorted, and prevents a multi-output signal from being generated.

14 Claims, 7 Drawing Sheets

SHIFT REGISTER AND METHOD FOR DRIVING THE SAME

This application claims the benefit of the Korean Patent Application No. 10-2005-0033589, filed on Apr. 22, 2005, which is hereby incorporated by reference as if fully set forth herein.

BACKGROUND OF THE INVENTION

1. Field of the Invention

The present invention relates to a shift register, and more particularly, to a shift register that includes a plurality of stages where each stage supplies a scan pulse to the next stage and independently to a gate line and thus, preventing the scan pulse applied to the next stage from being distorted, and a method for driving the same.

2. Discussion of the Related Art

Generally, a Liquid Crystal Display (LCD) includes a liquid crystal panel in which a plurality of pixel areas are arranged in the form of a matrix and a drive circuit for driving the liquid crystal panel. A desired image is displayed by controlling an optical transmission rate of the liquid crystal in the liquid crystal panel by using electric fields.

The liquid crystal panel includes a plurality of gate lines and a plurality of data lines intersecting with the gate lines. The gate lines and the data lines are perpendicular to each other at predetermined areas and the predetermined areas serve as pixel areas. The liquid crystal panel includes pixel electrodes for applying electric field to individual pixel areas in conjunction with a common electrode.

Each pixel electrode is connected to the data line via source and drain electrodes of a Thin Film Transistor (TFT) acting as a switching element. The TFT is switched on by a scan pulse applied to a gate electrode of the TFT via the gate line such that a data signal of the data line can charge the pixel electrode.

The drive circuit includes a gate drive for driving the gate lines, a data drive for driving the data lines, a timing controller for providing control signals capable of controlling the gate drives and the gate drives, and a power-supply unit for providing various drive voltages for use in an LCD.

The timing controller controls drive times of the gate drive and the data drive and transmits pixel data signal to the data drive. The power-supply unit steps up or down an input power-supply signal, such that it generates a variety of drive voltages required for the LCD including a common voltage (VCOM), a gate high voltage signal (VGH), and a gate low voltage signal (VGL).

The gate drive sequentially transmits a scan pulse to the plurality of gate lines such that liquid crystal cells of the liquid crystal panel in line units are sequentially operated. The data drive transmits a pixel voltage signal to individual data lines whenever the scan pulse is applied to one of the gate lines. Therefore, the LCD controls the optical transmission rate by an electric field applied between the pixel electrode and the common electrode according to the pixel voltage signal for each liquid crystal cell such that a desired image is displayed.

The gate drive includes a shift register for sequentially outputting the above-mentioned scan pulses. The shift register will hereinafter be described with reference to FIG. 1, which illustrates a related art shift register.

Referring to FIG. 1, the related art shift register includes N stages 100a~100e dependently connected to each other and a single dummy stage 100f connected to the last of the N stages. In this case, individual stages 100a~100e output scan pulses Vout1~Voutn, respectively. The scan pulses Vout1~Voutn are sequentially generated from the first stage 100a to the N-th stage 100e. The scan pulses Vout1~Voutn generated from the stages 100a~100e are sequentially applied to corresponding gate lines of the liquid crystal panel (not shown) such that the gate lines are sequentially scanned.

The stages 100a~100e and the dummy stage 100f of the shift register receive a first source voltage VDD and a second source voltage VSS. The first source voltage VDD is a straight-polarity voltage and the second voltage VSS is a ground voltage. The stages 100a~100f also receive two clock pulses from among first to fourth clock pulses CLK1~CLK4 having a sequential phase difference with each other.

The first stage 100a receives a start pulse (SP) along with the first and second voltages VDD~VSS and two clock pulses from among the first to fourth clock pulses CLK1~CLK4.

Operations of the above-mentioned conventional shift register will hereinafter be described in detail.

Referring to FIG. 1, the start pulse (SP) generated from the timing controller (not shown) applied to the first stage 100a enables the first stage 100a. The enabled first stage 100a receives the first and second clock pulses CLK1 and CLK2 from the timing controller, outputs the first scan pulse Vout1, and transmits the first scan pulse Vout1 to the corresponding first gate line and to the second stage 100b to enable the second stage 100b. The second stage 100b answers the first scan pulse Vout1 when it is enabled.

The enabled second stage 100b receives the second and third clock pulses CLK2 and CLK3 from the timing controller, outputs the second scan pulse Vout2, and transmits the second scan pulse Vout2 to the corresponding second gate line, the third stage 100c, and to the first stage 100a. The second pulse Vout2 enables the third stage 100c which in turn answers the second scan pulse Vout2 when it is enabled. The second pulse Vout2 disable the first stage 100a such that the first stage transmits the second source voltage VSS, i.e. the ground voltage, to the first gate line to thereby deactivate the first gate line.

The enabled third stage 100c receives the third and fourth clock pulses CLK3 and CLK4 from the timing controller, outputs the third scan pulse Vout3, and transmits the third scan pulse Vout3 to the third gate line, to the fourth stage 100d, and to the second stage 100b. The fourth stage 100d answers the third scan pulse Vout3 when it is enabled and second stage 100b transmits the second source voltage VSS to the second gate line.

In a similar manner, the fourth to N-th scan pulses Vout4~Voutn are sequentially transmitted to the fourth to N-th stages 100a~100e, such that they are sequentially applied to the fourth to N-th gate lines. As a result, the first to N-th gate lines are sequentially scanned by the first to N-th scan pulses Vout1~Voutn.

The dummy stage 100f answers the N-th scan pulse Voutn generated from the N-th stage 100e when it is enabled. Thereafter, the dummy stage 100f receives two clock pulses from the timing controller, and outputs the (N+1)-th scan pulse (Voutn+1). The (N+1)-th scan pulse (Voutn+1) is applied to the N-th stage 100e, such that the N-th stage 100e can provide the N-th gate line with the second source voltage VSS. In other words, the dummy stage 100f provides the (N+1)-th scan pulse (Voutn+1) to disable the N-th stage 100e such that the N-th output the second source voltage VSS. The dummy stage 100f does not transmit the (N+1)-th scan pulse (Voutn+1) to the gate line. Therefore, the number of all stages 100a~100f including the above-mentioned dummy stage 100f is always higher than the number of the gate lines by one.

The above-mentioned related art shift register has the following problems.

FIG. 2 shows a normal scan pulse and a distorted scan pulse. It is desirable to have a large LCD area. However, larger LCD area requires longer gate lines. Unfortunately, longer gate lines are accompanied by higher resistances and capacitances.

As can be seen from FIG. 2, a scan pulse applied to the gate line may be distorted by the resistance and capacitance components. For example, a rising time of the scan pulse can increase such that a waveform of the scan pulse becomes distorted.

In the related art shift register, each of the stages 100a~100e outputs a single scan pulse. Individual scan pulses generated from the stages 100a~100e are simultaneously applied to the gate line, the next stage, and the previous stage which can result in a serious noise problem in the above-mentioned scan pulses. In other words, individual scan pulses generated from individual stages 100a~100e are applied to not only the corresponding gate line, but also to other stages acting as resistance and capacitance components, such that distortion of the scan pulse is increased.

The distorted scan pulse has a rising time longer than that of a normal scan pulse, such that a valid charge time maintained at a target voltage is shortened. If the distorted scan pulse is applied to a gate electrode of the TFT, a turn-ON time of the TFT is also shortened such that a switching time during which the turned-on TFT switches a data voltage of the data line is shortened as well. In conclusion, the data voltage applied to the pixel electrode via drain and source terminals of the turned-ON TFT is distorted such that the pixel electrode cannot be sufficiently charged with the data voltage.

If the above-mentioned distorted scan pulses are applied to individual stages 100a~100e, multiple output signals are generated from the stages 100a~100e and are re-applied to the stages 100a~100e. As a result, switching elements contained in individual stages 100a~100e deteriorate such that unexpected erroneous operations may occur, and even worse, the switching elements may be greatly damaged.

SUMMARY OF THE INVENTION

Accordingly, the present invention is directed to a shift register and a method for driving the same that substantially obviate one or more problems due to limitations and disadvantages of the related art.

An object of the present invention is to provide a shift register and a method for driving the same, which transmit at least two independent scan pulses by individual stages, transmit one of the two independent scan pulses to a gate line and transmit the other one to the next stage so that the load applied to individual scan pulses is reduced resulting in minimum distortion of the scan pulses.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an embodiment of a shift register comprises a plurality of stages dependently connected to each other, wherein each of the plurality of stages is configured to independently generate first and second scan pulses such that the first scan pulse is simultaneously applied to a previous stage and to a corresponding gate line of a liquid crystal panel, and the second scan pulse is applied to a next stage.

In another embodiment of the present invention, a method for driving a shift register equipped with a plurality of stages serially connected to each other comprises the steps of, for each stage, independently generating first and second scan pulses, simultaneously transmitting the first scan pulse to a previous stage and a corresponding gate line of a liquid crystal panel, and transmitting the second scan pulse to a next stage.

In another embodiment of the present invention, a shift register comprises a plurality of stages, wherein the plurality of stages are connected serially, wherein each stage comprises a plurality of output units each configured to generate a corresponding scan pulse, and wherein the scan pulses from the plurality of output units of each stage are provided to a corresponding gate line of a display, to a previous stage, and to a next stage.

It is to be understood that both the foregoing general description and the following detailed description of the present invention are exemplary and explanatory and are intended to provide further explanation of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
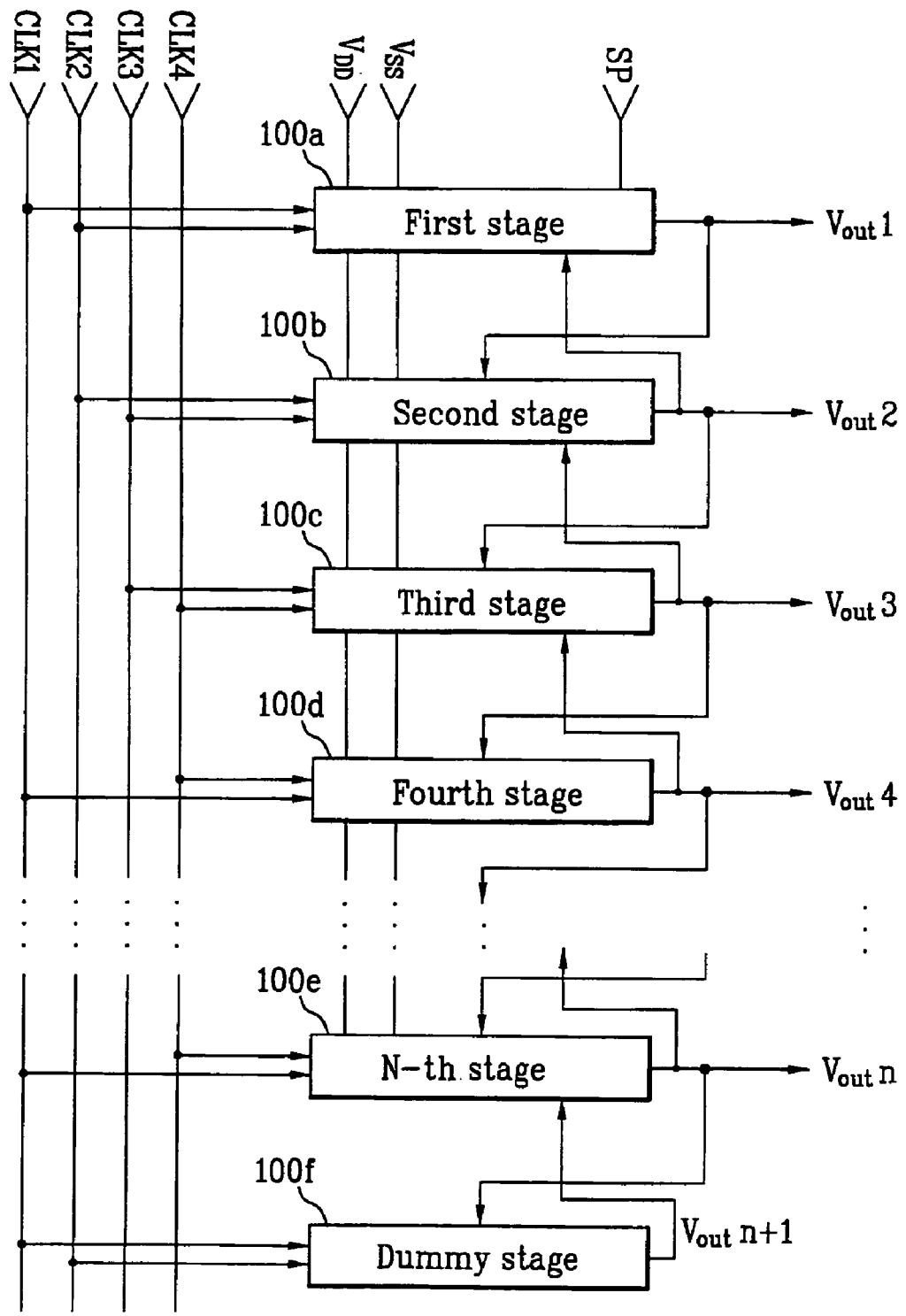
FIG. 1 is a circuit diagram illustrating a related art shift register.
Figure 2:
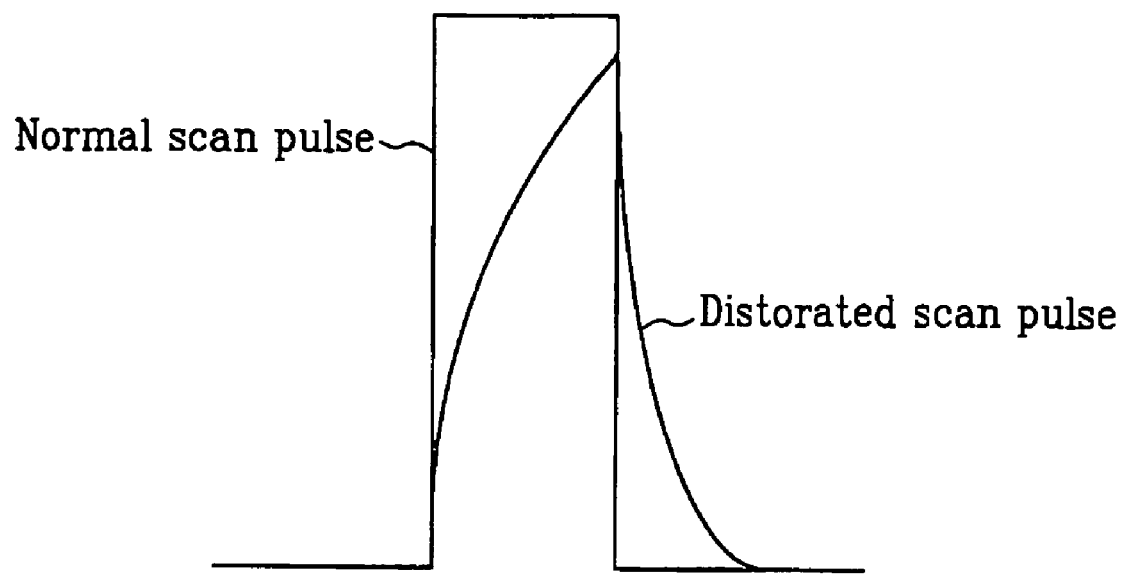
FIG. 2 shows a normal scan pulse and a distorted scan pulse.
Figure 3:
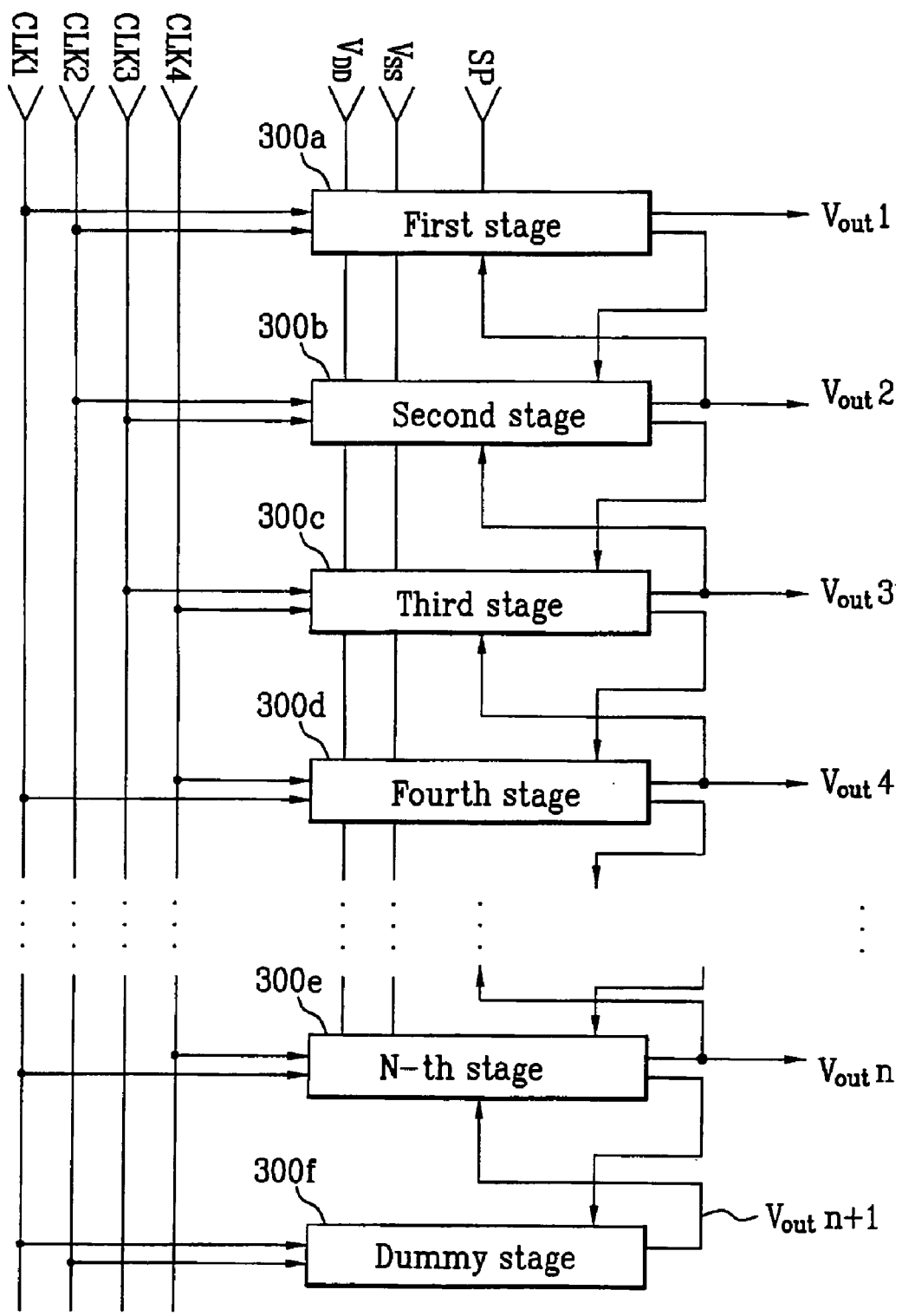
FIG. 3 is a circuit diagram illustrating a shift register according to an embodiment of the present invention.

FIG. 3 is a circuit diagram illustrating a shift register according to an embodiment of the present invention. As illustrated, the shift register includes N stages 300a~300e serially connected to each other, and a single dummy stage 300f. In this instance, each of the individual stages 300a~300e outputs at least two independent scan pulses. One of the two scan pulses is applied to both a gate line of a corresponding stage of a liquid crystal panel (not shown) and a previous stage, and the other one is applied to the next stage. However, it should be noted that more than two independent scan pulses may be outputted by each stage.

The scan pulses independently generated from individual stages 300a~300e have essentially the same phase and the same magnitude. In other words, two scan pulses generated from one stage are substantially identical to each other. One of the two scan pulses is applied to the corresponding gate line and the previous stage, and the other one is applied to the next stage.

It should be noted other connections are possible. For example, while not shown, one of the two scan pulses can be applied to the previous stage only and the other scan pulse can be applied to the corresponding gate line and simultaneously to the next stage. As another example, one scan pulse can be applied to the corresponding gate line only and the other scan pulse can be applied to the previous and to the next stages.

If more than two independent scan pulses are generated by each stage, the previous stage, the gate line, and the next stage may all be supplied with individually generated scan pulses. This helps to reduce the scan pulse distortion even further. Indeed, if more than three scan pulses are generated by a stage, then more than one scan pulses may be combined to drive the gate line for example if more drive capacity is desired.

As can be seen from FIG. 3, the second stage 300b independently outputs two scan pulses Vout2. One of the two scan pulses Vout2 is applied to the first stage 300a and to the second gate line, and the other scan pulse Vout2 is applied to the third stage 300c. In a similar manner, each of the third to the N-th stages 300c~300e outputs two scan pulses. One of the two scan pulses is applied to the previous stage and to the corresponding gate line, and the other scan pulse is applied to the next stage.

The first stage 300a outputs two first scan pulses Vout1. One of the two first scan pulses Vout1 is applied to the first gate line and the other one is applied to the second stage 300b. There is no stage previous to the first stage 300a.

The dummy stage 300f outputs a single (N+1)-th scan pulse (Voutn+1) and transmits the (N+1)-th scan pulse (Voutn+1) to the N-th stage 300e. The dummy stage 300f may have the same configuration as those of the remaining stages. In this instance, the dummy stage 300f transmits one of two (N+1)-th scan pulses to the N-th stage but does not transmit the other one of the two (N+1)-th scan pulses to any place. In other words, an output terminal (i.e., an output terminal of the dummy stage) at which the other one of the two (N+1)-th scan pulses can be floated.

Individual stages 300a~300e sequentially output the independent scan pulses. More specifically, the first stage 300a outputs the two first scan pulses Vout1 followed by the second stage 300b outputting the two second scan pulses Vout2, which is followed by the third stage 300c outputting the two third scan pulses Vout3, and so on until finally the N-th stage 300e outputs the two N-th scan pulses Voutn.

After the N-th stage 300e outputs the two N-th scan pulses Voutn, the dummy stage 300f outputs a single (N+1)-th scan pulse (Voutn+1). The (N+1)-th scan pulse (Voutn+1) generated from the dummy stage 300f is applied to only the N-th stage 300e.

All stages 100a~100f of the shift register receive first and second source voltages VDD and VSS. The first source voltage VDD may be a straight polarity voltage and the second source voltage VSS may be a ground voltage. The stages also receive two clock pulses from among first to fourth clock pulses CLK1~CLK4 circulating with a sequential phase difference with each other.

The first stage 300a positioned at the uppermost position receives a start pulse (SP) along with the first and second source voltages VDD and VSS and two clock pulses CLK1 and CLK2 from among the first to fourth clock pulses CLK1~CLK4.

As stated above, the first to fourth clock pulses CLK1~CLK4 are sequentially phase-delayed (i.e., phase-shifted) by a single pulse width (i.e., a phase difference) therebetween. In other words, the second clock pulse CLK2 is phase-delayed by a single pulse width compared with the first clock pulse CLK1, the third clock pulse CLK3 is phase-delayed by a single pulse width compared with the second clock pulse CLK2, and the fourth clock pulse CLK4 is phase-delayed by a single pulse width compared with the third clock pulse CLK3. The cycle repeats as first clock pulse CLK1 is phase-delayed by a single pulse width compared with the fourth clock pulse CLK4.

The start pulse (SP) is applied to the first stage 300a to start the process of sequentially generating the scan pulses. The start pulse (SP) precedes the first clock pulse CLK1 by a single clock pulse width. For an image frame, the start pulse (SP) is outputted only once.

In order to enable individual stages 300a~300e of the shift register to output two scan pulses, individual stages 300a~300e have the following configuration. The configurations of the second to N-th stages 300b~300e are identical or substantially identical to each other such that only the first stage 300a and the second stage 300b will be described as an example of the present invention.

Figure 4:
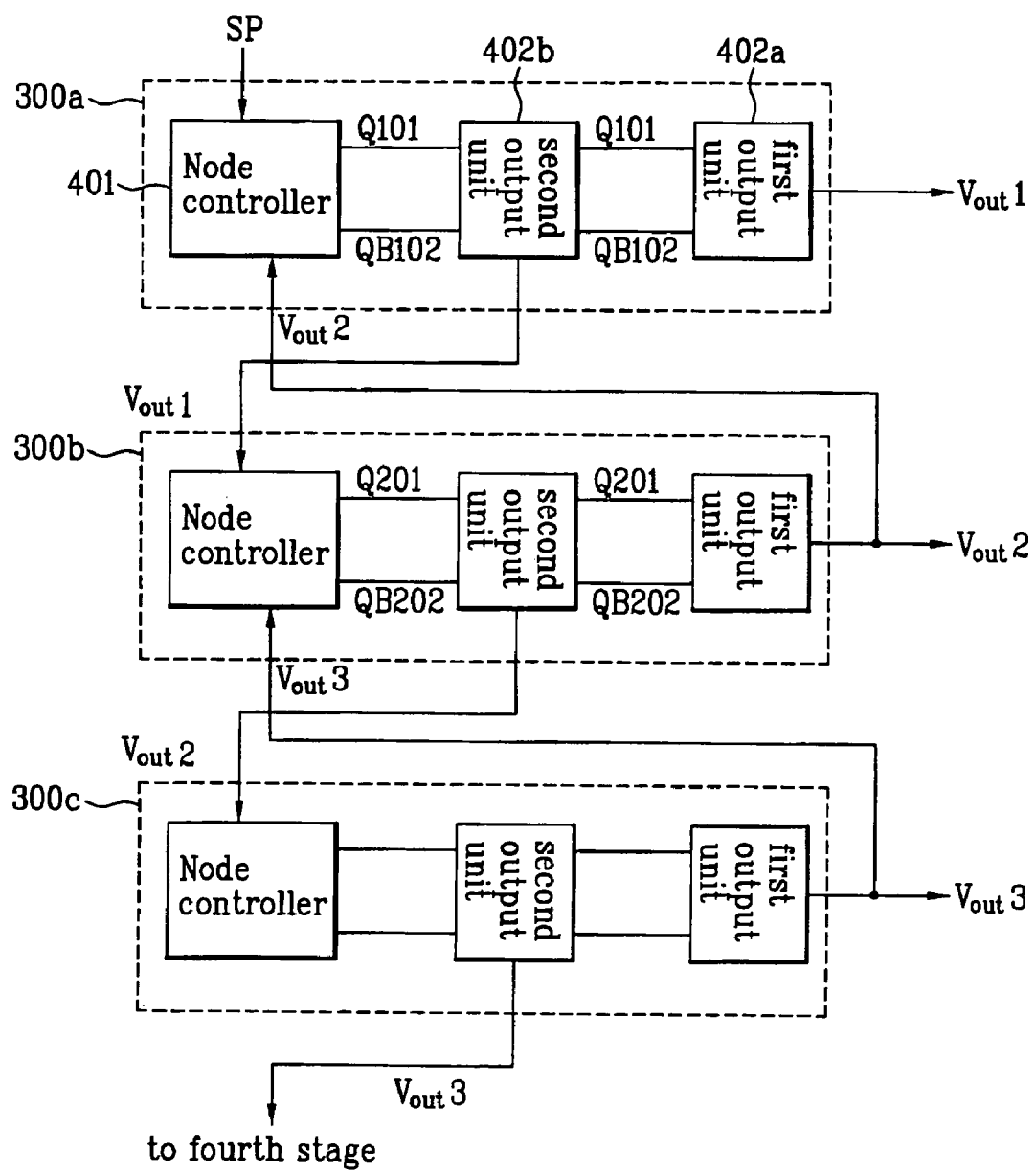
FIG. 4 is a detailed circuit diagram illustrating first to third stages shown in FIG. 3 according to an embodiment of the present invention.

FIG. 4 is a detailed circuit diagram illustrating first to third stages shown in FIG. 3 according to an embodiment of the present invention. As illustrated, the first stage 300a includes a node controller 401, a first output unit 402a, and a second output unit 402b. The node controller 401 controls charging/discharging operations of a first node Q101 and a second node QB102.

The first output unit 402a outputs one of two first scan pulses Vout1 or the second source voltage VSS according to states of the first and second nodes Q101 and QB102 and transmits the first scan pulse Vout1 or the second source voltage VSS to the first gate line of a liquid crystal panel.

The second output unit 402b outputs the other of two first scan pulse Vout1 or the second source voltage VSS according to states of the first and second nodes Q101 and QB102 and transmits the first scan pulse Vout1 or the second source voltage VSS to the second stage 300b.

Referring back to FIG. 4, the first node Q101 and the second node QB102 are alternately charged or discharged. More specifically, if the first node Q101 is charged with electricity, then the second node QB102 is discharged. Conversely, if the second node QB102 is charged, then the first node Q101 is discharged. The charged/discharged states of the first and second nodes Q101 and QB102 are controlled by a plurality of switching elements (not shown in FIG. 4) in the node controller 401.

The first output unit 402a includes a pull-up drive (not shown) for providing the first gate line with one of the first scan pulses Vout1 when the first node Q101 is charged with electricity. The first output unit 402a also includes a pull-down drive (not shown) for providing the first gate line with the second source voltage VSS when the second node QB102 is charged.

The second output unit 402b includes a pull-up drive (not shown) for providing the second stage 300b with the other of the first scan pulses Vout1 when the first node Q101 is charged and a pull-down drive (not shown) for providing the second stage 300b with the second source voltage VSS when the second node QB102 is charged.

It bears repeating that more than two output units are possible. All output units may include a pull-up drive and a pull-down drive behaving in a similar manner to the first and second output units described above to output either the scan pulse or the second source voltage.

The second to N-th stages 300b~300e can be structurally equivalent to the first stage 300a. The first output unit 402a of each of the second to N-th stages 300b~300e outputs one of the corresponding scan pulses or the second source voltage VSS and transmits the same to the previous stage and to the corresponding gate line of the stage. The second output unit 402b of each stage outputs the second of the corresponding scan pulses or the second source voltage VSS and transmits the same to the next stage.

However, other combinations are possible. As an example, the first of the scan pulses may be transmitted to the corresponding gate line only and the second of the scan pulses may be transmitted to the previous and next stages. As another example, the first of the scan pulses may be transmitted only to the previous stage and the second of the scan pulses may be transmitted to the corresponding gate line and to the next stage.

In addition, as noted previously, the number of the output units is not limited to two. For example, the first stage 300a (and subsequent stages) may include a third output unit configured to generate and output another first scan pulse Vout1. Each output unit may include pull-up and pull-down drives to output a scan pulse or the voltage VSS as described above, and the scan pulses may be transmitted to the previous stage, to the gate line, and to the next stage as desired to reduce the scan pulse distortion.

The dummy stage 300f includes at least one output unit. Only one output unit is required for the dummy stage so that the (N+1)-th scan pulse (Voutn+1) is transmitted to the N-th stage 300e. The structure of the dummy stage 300f may be similar to any of the other stages 300a~300f, but only one output unit need to be utilized.

Driving methods of the first to third stages 300a~300c will hereinafter be described in detail. As noted previously, the first to third stages 300a~300c sequentially output multiple scan pulses Vout1~Vout3. In response to the start pulse (SP) generated from the timing controller, the first stage 300a outputs two first scan pulses Vout1. The start pulse SP may be viewed as an enable signal to the first stage 300a.

More specifically, the first output unit 402a of the first stage 300a outputs one first scan pulse Vout1 and the second output unit 402 of the first stage 300a outputs the other first scan pulse Vout1. The first stage 300a transmits the one first scan pulse Vout1 generated from the first output unit 402a to the first gate line and transmits the other first scan pulse Vout1 generated from the second output unit 402b to the next stage, i.e. the second stage 300b, as an enable signal to the next stage.

In response to the enable signal generated from the second output unit 402b of the first stage 300a, the second stage 300b outputs two second scan pulses Vout2 via the first and second output units 402a and 402b in a similar manner described above with respect to the output units of the first stage 300a. The second stage 300b transmits the second scan pulse Vout2 generated from the first output unit 402a to the second gate line and to the first stage 300a as a disable signal. The second stage 300b transmits the second scan pulse Vout2 generated from the second output unit 402b to the next stage, i.e. the third stage 300c, an enable signal.

In other words, the shift register according of the present embodiment allows individual stages 300a~300e to generate at least two scan pulses, and the at least two scan pulses are applied to the gate line, to the previous stage, and to the next stage such that load on individual scan pulses Vout1~Voutn is reduced as compared to the related art shift register. As a result, the shift register of the present embodiment can prevent or minimize distortions of the scan pulses.

Detailed descriptions of the node controller and the first and second output units will hereinafter be described.

Figure 5:
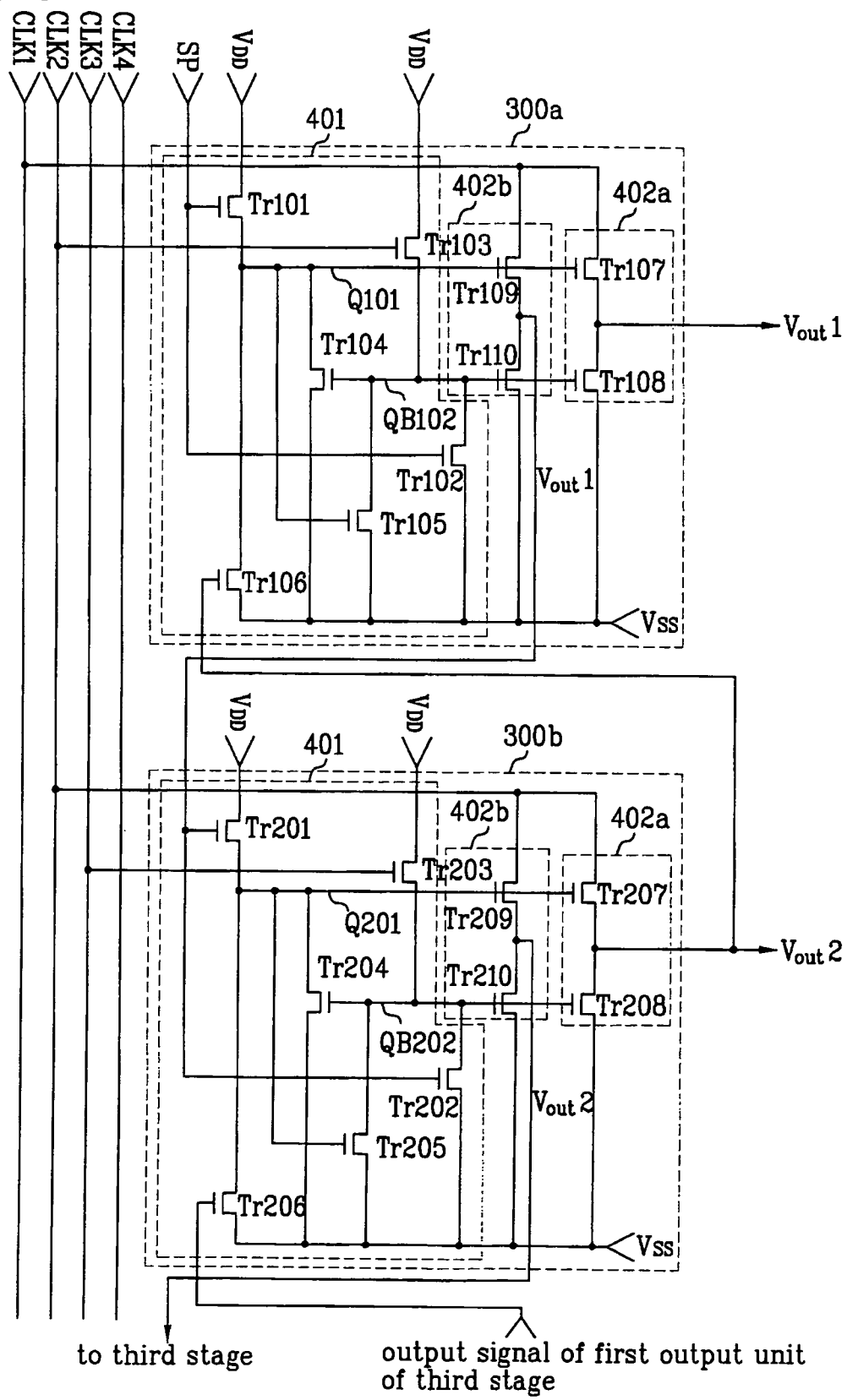
FIG. 5 is a circuit diagram illustrating a node controller, a first output unit, and a second output unit, which are included in each of the first and second stages according to an embodiment of the present invention.

FIG. 5 is a circuit diagram illustrating the node controller, the first output unit, and the second output unit, which are included in each of the first and second stages, according to an embodiment of the present invention.

Referring to FIG. 5, the node controller 401 of the first stage 300a includes a first NMOS transistor Tr101, a second NMOS transistor Tr102, a third NMOS transistor Tr103, and a fourth NMOS transistor Tr104. The first NMOS transistor Tr101 switches on upon receiving the start pulse (SP) from the timing controller such that the first node Q101 is charged via the first source voltage VDD.

The second NMOS transistor Tr102 also switches on upon receiving the start pulse (SP) from the timing controller such that the second node QB102 is discharged via the second source voltage VSS. The second source voltage may be a ground voltage.

The third NMOS transistor Tr103 is switched on by a second clock pulse CLK2, which in turn charges second node QB102 via the first source voltage VDD. The second clock pulse CLK2 is delayed by one pulse width from the first clock pulse CLK1, which in turn is delayed by one pulse width from the start pulse SP.

The fourth NMOS transistor Tr104 is switched on by the second node QB102 being charged via the first source voltage VDD. When the fourth NMOS transistor Tr104 switches on, the first node Q101 is discharged via the second source voltage VSS.

The node controller 401 further includes a fifth NMOS transistor Tr105 and a sixth NMOS transistor Tr106. The fifth NMOS transistor Tr105 is switched on when the first node Q101 is charged via the first source voltage VDD through the first NMOS transistor Tr101 being switched on. When switched on, the fifth NMOS transistor Tr105 discharges the second node QB102 via the second source voltage VSS.

The sixth NMOS transistor Tr106 is switched on upon receiving the second scan pulse Vout2 from the first output unit 402a of the second stage 300b. When switched on, the sixth NMOS transistor Tr106 discharges the first node Q101 via the second source voltage VSS.

The first output unit 402a includes a pull-up drive and a pull-down drive. The pull-up drive of the first output unit 402a includes a seventh NMOS transistor Tr107. The seventh NMOS transistor Tr107 is switched on by the first source voltage VDD charged in the first node Q101. When switched on, the seventh NMOS transistor Tr107 transmits the first clock pulse CLK1 to the first gate line as one of the first scan pulses Vout1.

The pull-down drive of the first output unit 402a includes an eighth NMOS transistor Tr108. The eighth NMOS transistor Tr108 is switched on by the first source voltage VDD charged in the second node QB102. When switched on, the eighth NMOS transistor Tr108 transmits the second source voltage VSS as the output of the first output unit.

As noted previously, the first and second nodes Q101 and QB102 are alternately charged and discharged. In other words, one is charged and the other is discharged always. Thus, only one of the pull-up drive and the pull-down drive is activated at any given moment.

The second output unit 402b also includes a pull-up drive and a pull-down drive. The pull-up drive of the second output unit 402b includes a ninth NMOS transistor Tr109. The ninth NMOS transistor Tr109 is switched on by the first source voltage VDD charged in the first node Q101. When switched on, the ninth NMOS transistor Tr109 transmits the first clock pulse CLK1 to the second stage 300b.

The pull-down drive of the second output unit 402b includes a tenth NMOS transistor Tr110. The tenth NMOS transistor Tr110 is switched on by the first source voltage VDD charged in the second node QB102. When switched on, the tenth NMOS transistor Tr110 transmits the second source voltage VSS to the second stage 300b. Again, output conflict is prevented or minimized since only one of the pull-up and pull-down drives is activated at any given time.

Further, while NMOS transistors are illustrated in FIG. 5, it should be noted that other types of transistors are also applicable. For example, PMOS and/or CMOS circuits may be utilized. Indeed, types of switching devices may be applicable.

The node controller 401 of the second stage 300b can be structurally substantially identical to that of the first stage 300a. Similarly, the pull-up and pull-down drives of the output units of the second stage 300b may be structurally substantially identical to the output units of the first stage.

The pull-up and pull-down drives of the first output unit 402a of the second stage 300b provide the second gate line with either the second scan pulse Vout2 or the second source voltage VSS and also provide the same to the previous stage, i.e. the first stage 300a. This is slightly different from the first stage since the first stage does not have a previous stage. The third to N-th stages 300c~300e can have substantially identical structures as that of the second stage 300b.

Generally, the eighth and tenth NMOS transistors Tr108 and Tr110 of the pull-down drives can deteriorate more than the seventh and ninth NMOS transistors Tr07 and Tr109 of the pull-up drives. This is mainly due to the second node QB102 connected to gate terminals of the eight and tenth NMOS transistors Tr108 and Tr110 maintaining a charged state a longer period of time than that of the first node Q101.

In order to prevent or minimize the occurrence of the above-mentioned deterioration problem, a channel width of the eighth NMOS transistor Tr108 of the first output unit 402a is preferred to be larger than that of the seventh NMOS transistor Tr107. Also, a channel width of the tenth NMOS transistor Tr110 of the second output unit 402b is preferred to be larger than that of the ninth NMOS transistor Tr109.

Further, individual channel widths of the seventh and eighth NMOS transistors Tr107 and Tr108 of the first output unit 402a and individual channel widths of the ninth and tenth NMOS transistors Tr109 and Tr110 of the second output unit 402b are preferred to satisfy the following expression:

[Expression]

(Channel width of Ninth NMOS transistor Tr109/
Channel width of Tenth NMOS transistor Tr110)
<(Channel width of Seventh NMOS transistor
Tr107/Channel width of Eighth NMOS transistor
Tr108)

In other words, a ratio of the channel width of a pull-up switching element to the pull-down switching element of the first output unit is preferred to be higher than a ratio of the channel width of a pull-up switching element to the pull-down switching element of the second output unit.

Needless to say, the above-mentioned expression is applicable to not only the above-mentioned first stage 300a, but also the remaining stages other than the first stage 300a.

The order of first to fourth clock pulses CLK1~CLK4 applied to individual stages 300a~300e will hereinafter be described with reference to the following Table 1:

TABLE 1

| | SEVENTH AND EIGHTH NMOS TRANSISTORS (TR107, TR108), (TR207, TR208), etc. | Third NMOS transistor (Tr103), (Tr203), etc. |
| --- | --- | --- |
| First Stage (300a) | First clock pulse (CLK1) | Second clock pulse (CLK2) |
| Second Stage (300b) | Second clock pulse (CLK2) | Third clock pulse (CLK3) |
| Third Stage (300c) | Third clock pulse (CLK3) | Fourth clock pulse (CLK4) |
| Fourth Stage (300d) | Fourth clock pulse (CLK4) | First clock pulse (CLK1) |

With reference to Table 1, the third NMOS transistor Tr103 of the first stage 300a receives the second clock pulse CLK2 and the seventh and eighth transistors Tr107 and Tr108 receive the first clock pulse CLK1. The third NMOS transistor Tr203 of the second stage 300b sequentially receives the third clock pulse CLK 3 and the seventh and eighth transistors Tr207 and Tr208 receive the second clock pulse CLK2. The third NMOS transistor of the third stage 300c receives the fourth clock pulse CLK4 and the seventh and eighth NMOS transistors receive the third clock pulse CLK3. The third NMOS transistor of the fourth stage 300d receives the first clock pulse CLK1 and the seventh and eighth NMOS transistors receive the fourth clock pulse CLK4.

The third NMOS transistor of the fifth stage (not shown) receives the second clock pulse CLK2 in the same manner as in the third NMOS transistor Tr103 of the first stage 300a. The seventh and eighth NMOS transistors of the fifth stage receive the first clock pulse CLK1 in the same manner as in the seventh and eighth NMOS transistors Tr107 and Tr108 of the first stage 300a. However, because the enable signal from the fourth stage 300d is not received until after the fourth stage is enabled, the fifth stage outputs the scan pulses that are delayed.

The first to fourth clock pulses CLK1-CLK4, which re-circulate according to the same order as that of the first to fourth clock pulses CLK1~CLK4 applied to the first to fourth stages 300a~300d, are applied to stages from the fifth stage to the dummy stage 300f.

Figure 6A:
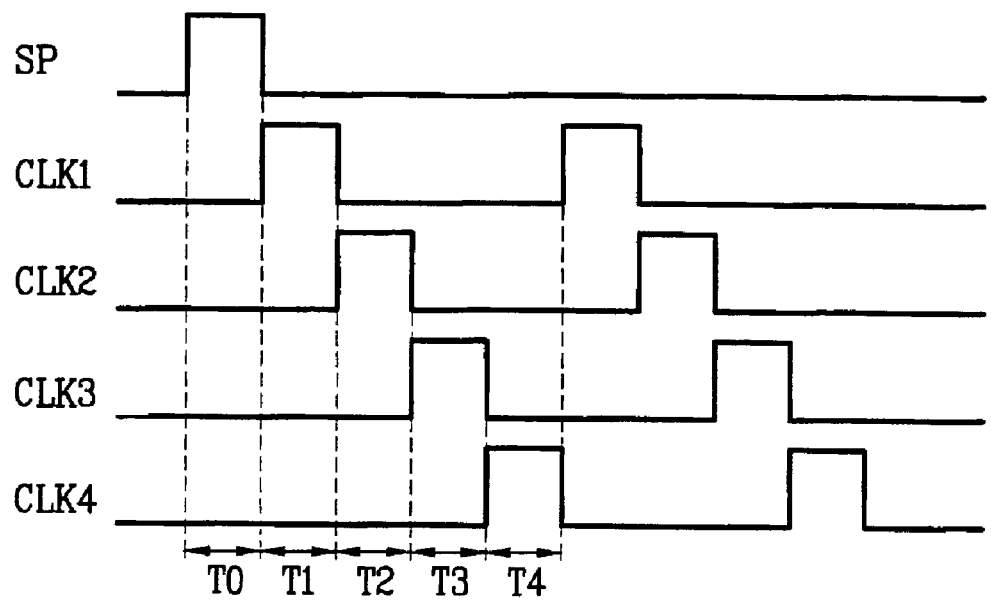
FIG. 6A is a timing diagram illustrating clock pulses applied to individual stages shown in FIG. 5 according to an embodiment of the present invention.
Figure 6B:
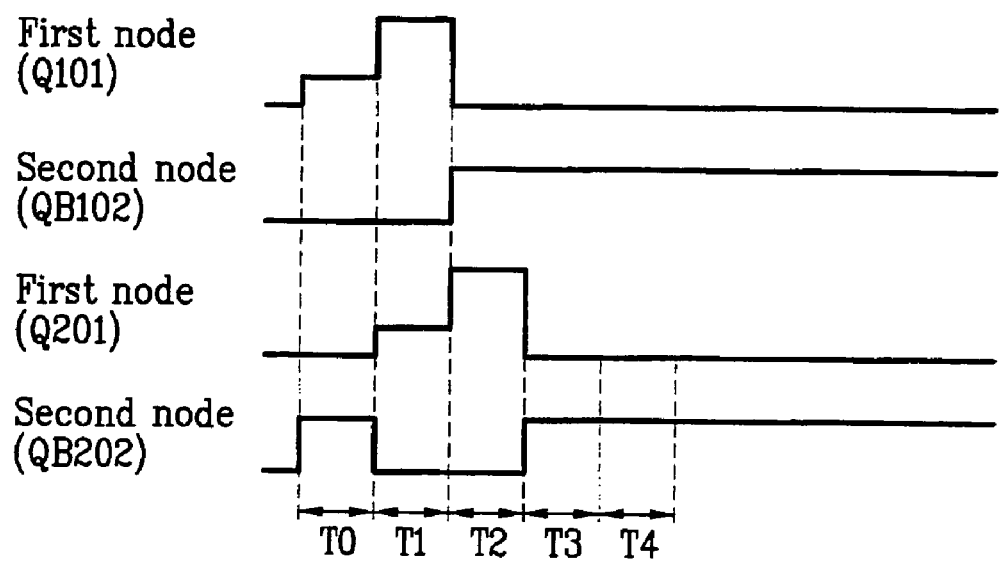
FIG. 6B is a timing diagram illustrating first and second source voltages applied to nodes of individual stages shown in FIG. 5 according to an embodiment of the present invention.
Figure 6C:
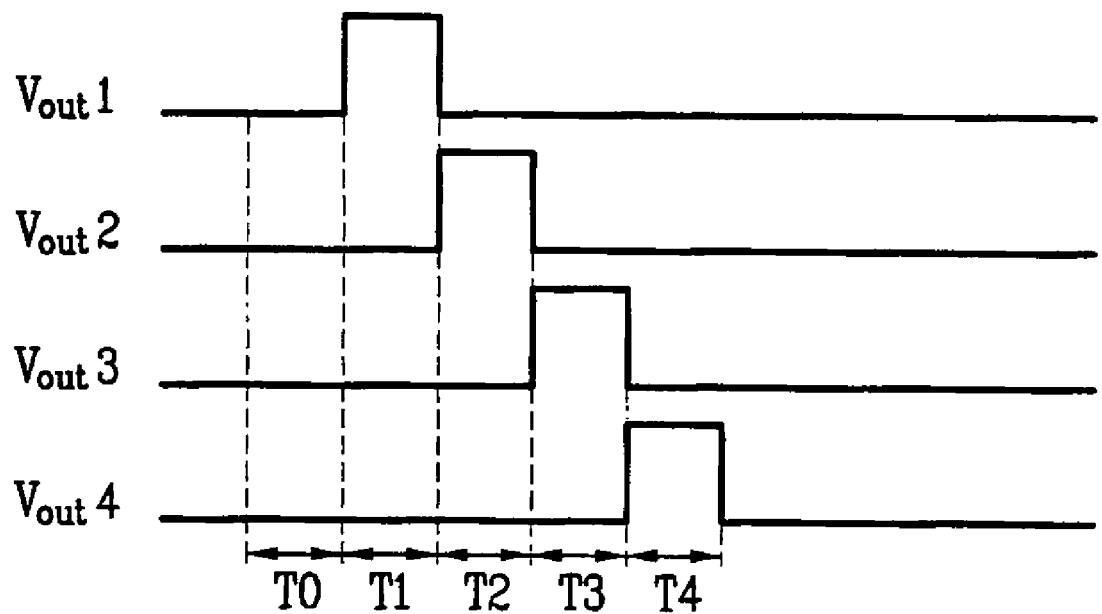
FIG. 6C is a timing diagram illustrating scan pulses generated from individual stages shown in FIG. 5 according to an embodiment of the present invention.

Operations of the shift register according to the present embodiment will hereinafter be described with reference to FIGS. 6A~6C. FIG. 6A is a timing diagram illustrating clock pulses applied to individual stages shown in FIG. 5, FIG. 6B is a timing diagram illustrating first and second source voltages applied to nodes of individual stages shown in FIG. 5, and FIG. 6C is a timing diagram illustrating scan pulses generated from individual stages shown in FIG. 5.

The first to tenth NMOS transistors Tr101~Tr110 of the first stage 300a shown in FIG. 5, and the first to tenth NMOS transistors Tr201~Tr210 of the second stage 300b are depicted in different numbers. However, it should be noted that the first to tenth NMOS transistors Tr101~Tr110 acting as switching elements can be equivalent to the first to tenth NMOS transistors Tr201~Tr210.

Operations generated during an enable period T0 will hereinafter be described.

As can be seen from FIG. 6A, the start pulse (SP) is in a logic high state during the enable period T0. The start pulse (SP) generated from the timing controller is applied to the first stage 300a. As can be seen from FIG. 5, the start pulse (SP) is applied to the gate terminal of the first NMOS transistor Tr101 of the first stage 300a such that the first NMOS transistor Tr101 is switched on. In this case, the first source voltage VDD is applied to the first node Q101 via drain and source terminals of the turned-ON first NMOS transistor Tr101 to charge the first node Q101. As a result, the fifth, seventh, and ninth NMOS transistors Tr105, Tr107, and Tr109, gate terminals of which are commonly connected to the first node Q101, are simultaneously turned on.

Also, the second NMOS transistor Tr102 is switched on by the start pulse (SP). In this case, the second source voltage VSS is applied to the second node QB102 via source and drain terminals of the turned-ON second NMOS transistor Tr102 to discharge the second node QB102. As a result, the fourth, eighth, and tenth NMOS transistors Tr104, Tr108, and Tr110, gate terminals of which are commonly connected to the second node QB102, are simultaneously turned off.

Note that the second source voltage VSS is applied to the second node QB102 via source and drain terminals of the turned-ON fifth NMOS transistor Tr105. This allows the second mode QB102 to be more quickly discharged.

In brief, as can be seen from FIG. 6B, the first node Q101 is in a charged state during the enable time T0 and the second node QB102 is in a discharged state during the enable time T0, such that the first stage 300a is enabled.

Operations generated during a first period T1 will hereinafter be described. Referring back to FIG. 6A, only the first clock pulse CLK1 is in the logic high state during the first period T1 and the remaining clock pulses other than the first clock pulse CLK1 are in a logic low state during the first period T1. As a result, the first and second NMOS transistors Tr101 and Tr102 are turned off by the above-mentioned Start Pulse (SP) which is in the logical low state such that the first node Q101 is floated.

The first node Q101 is maintained in the charged state as a result of the first source voltage VDD having been applied to the first node Q101 during the enable time T0. As a result, the fifth, seventh, and ninth NMOS transistors Tr105, Tr107, and Tr109 remain on during the period T1.

In period T1, the first clock pulse CLK1 is applied to the drain terminal of the turned-ON seventh NMOS transistor Tr107 and the drain terminal of the turned-ON ninth NMOS transistor Tr109, such that the first source voltage VDD charged in the first node Q101 is amplified by a bootstrap action as shown in FIG. 6B. Therefore, the seventh and ninth NMOS transistors Tr107 and Tr109 may be described as being in a completely turned-on state. The first clock pulse CLK1 applied to both the drain terminal of the seventh NMOS transistor Tr107 and the drain terminal of the ninth NMOS transistor Tr109 is stably outputted via the above-mentioned seventh and ninth NMOS transistors Tr107 and Tr109 as the first of the scan pulses Vout1.

As can be seen from FIG. 6C, the first clock pulse CLK1 generated via the above-mentioned seventh NMOS transistor Tr107 is applied to the first gate line, such that it acts as the first scan pulse Vout1 for driving the first gate line. The first clock pulse CLK1 generated via the above-mentioned ninth NMOS transistor Tr109 is applied to the second stage 300b, such that it acts as a start pulse for enabling the second stage 300b.

In other words, the seventh NMOS transistor Tr107 of the first output unit 402a of the first stage 300a and the ninth NMOS transistor Tr109 of the second output unit 402b also of the first stage 300a output the multiple first scan pulses Vout1.

The first scan pulse Vout1 generated from the first output unit 402a is applied to the first gate line such that the first gate line is driven. The first scan pulse Vout1 generated from the second output unit 402b is applied to the second stage 300b such that the second stage 300b is enabled.

More specifically, the first scan pulse Vout1 generated from the second output unit 402b of the first stage 300a is applied to a gate terminal of the first NMOS transistor Tr201 of the second stage 300b, such that the first NMOS transistor Tr201 of the second stage 300b is turned on. In this case, the first source voltage VDD is applied to the first node Q201 via drain and source terminals of the turned-ON first NMOS transistor Tr201. Therefore, the first node Q201 is charged such that the seventh and ninth NMOS transistors Tr207 and Tr209, gate terminals of which are commonly connected to the first node Q201, are simultaneously turned on.

The first scan pulse Vout1 generated from the second output unit 402b is simultaneously applied to a gate terminal of the second transistor Tr202 of the second stage 300b to turn on the second NMOS transistor Tr202. In this case, the second source voltage VSS is applied to the second node QB202 via source and drain terminals of the turned-ON second NMOS transistor Tr202. Therefore, the second node QB202 is discharged such that the fourth, eighth, and tenth NMOS transistors Tr204, Tr208, and Tr210 of the second stage 300b, gate terminals of which are commonly connected to the second node QB202, are simultaneously turned off.

In brief, the first stage 300a outputs two first scan pulses Vout1 during the first period T1, transmits one of the two first scan pulses Vout1 to the first gate line to drive the first gate line, and transmits the other first scan pulse Vout1 to the second stage 300b to enable the second stage 300b. During the first period T1, the first and second NMOS transistors Tr201 and Tr202 of the second stage 300b are turned on by the first scan pulse Vout1. When this occurs, the first source voltage VDD is applied to the first node Q201 via drain and source terminals of the turned-ON first NMOS transistor Tr201 such that the first node Q201 is charged. The second source voltage VSS is applied to the second node QB202 via source and drain terminals of the turned-ON second NMOS transistor Tr202 such that the second node QB202 is discharged.

Operations generated during a second period T2 will hereinafter be described in detail.

As can be seen from FIG. 6A, during the second period T2, only the second clock pulse CLK2 is in the logic high state and the remaining clock pulses other than the second clock pulse CLK2 are in the logic low state. As a result, the first and second NMOS transistors Tr201 and Tr202 are turned off by the first scan pulse Vout1 which is in the logical low state in period T2 such that the first node Q201 is floated.

In the meantime, the first node Q201 is maintained in the charged state as a result of the first source voltage VDD having been applied to the first node Q201 during the first period T1. Thus, the fifth, seventh, and ninth NMOS transistors Tr205, Tr207, and Tr209 remain in a turned-on state during the period T2.

In period T2, the second clock pulse CLK2 is applied to the drain terminal of the turned-ON ninth NMOS transistor Tr209 such that the first source voltage VDD charged in the first node Q201 is amplified by the bootstrap action as shown in FIG. 6B. Therefore, the seventh and ninth NMOS transistors Tr207 and Tr209, gate terminals of which are connected to the first node Q201, are completely turned-ON. The second clock pulse CLK2 applied to both the drain terminal of the seventh NMOS transistor Tr207 and the drain terminal of the ninth NMOS transistor Tr209 is stably outputted via the above-mentioned seventh and ninth NMOS transistors Tr207 and Tr209 as the scan pulses Vout2.

As can be seen from FIG. 6C, the second clock pulse CLK2 generated via the seventh NMOS transistor Tr207 of the second stage 300b is applied to the second gate line such that it acts as the second scan pulse Vout2 for driving the second gate line, and at the same time is applied to the first stage 300a, i.e. the previous stage, such that it acts as a disable signal to the first stage 300a. The second clock pulse CLK2 generated via the ninth NMOS transistor Tr209 is applied to the third stage 300c, such that it acts as a start pulse for enabling the third stage 300c.

In other words, the seventh NMOS transistor Tr207 of the first output unit 402a of the second stage 300b and the ninth NMOS transistor Tr209 of the second output unit 402b also of the second stage 300b output the second scan pulses Vout2, respectively.

The second scan pulse Vout2 generated from the first output unit 402a is applied to the second gate line such that the second gate line is driven. Simultaneously, the same second can pulse Vout2 is applied to the first stage 300a such that the first stage 300a is disabled. The second scan pulse Vout2 generated from the second output unit 402b is applied to the third stage 300c such that the third stage 300c is enabled.

A process for disabling the first stage 300a will hereinafter be described.

During the second period T2, the second scan pulse Vout2 generated from the first output unit 402 of the second stage 300b is applied to a gate terminal of the sixth NMOS transistor Tr106 of the first stage 300a such that the sixth NMOS transistor Tr106 is turned on. The second source voltage VSS is applied to the first node Q101 via source and drain terminals of the turned-ON sixth NMOS transistor Tr106 to discharge the first node Q101 that was charged in a previous period. As a result, the fifth, seventh, and ninth NMOS transistors Tr105, Tr107, and Tr109, gate terminals of which are connected to the discharged second node QB102, are turned off.

The second clock pulse CLK2, which is in the logic high state during the second period T2, is applied to a gate terminal of the third NMOS transistor Tr103 of the first stage 300a such that the third NMOS transistor Tr103 is turned on. When this occurs, the first source voltage VDD is applied to the second node QB102 of the first stage 300a via drain and source terminals of the turned-ON third NMOS transistor Tr103 to charge the second node QB102 with electricity. As a result, the eighth NMOS transistor Tr108 is turned on such that the second source voltage VSS is applied to the first gate line via source and drain terminals of the turned-ON eighth NMOS transistor Tr108. During the second period T2, the remaining stages other than the second stage 300b transmit the second source voltage VSS to individual gate lines connected to the remaining stages. In the second period T2, the second output unit 402b of the first stage 300a transmits the second source voltage VSS to the second stage 300b.

In brief, during the second period T2, the second stage 300b generates two second scan pulses Vout2, and transmits one of the two second scan pulses Vout2 to the second gate and to the first stage 300a, such that the second gate line is operated and at the same time the first stage 300a is disabled. Also, the other one of the two second scan pulses Vout2 is applied to the third stage 300c, such that the third stage 300c is enabled.

in a similar manner, during a third period T3, the third stage 300c outputs two third scan pulses Vout3, operates a third gate line and at the same time disables the second stage 300b using one of the two third scan pulses and enables the fourth stage 300d by using the other one of the two third scan pulses Vout3. During a fourth period T4, the fourth stage 300d outputs two fourth scan pulses Vout4, operates a fourth gate line and at the same time disables the third stage 300c using one of the two four scan pulses and enables the fifth stage using the other one of the two fourth scan pulses Vout4.

The remaining fifth to N-th stages 300e are not explicitly described. However, it should be noted that the above-mentioned fifth to N-th stages 300e are operated in a similar manner as in the above-mentioned examples. The dummy stage 300f outputs a single (N+1)-th scan pulse (Voutn+1) and transmits the (N+1)-th scan pulse (Voutn+1) to the N-th stage 300e such that the N-th stage 300e is disabled.

As apparent from the above description, a shift register and a method for driving the same according to the embodiments of the present invention have the following advantages.

Each stage outputs at least two scan pulses, and the two scan pulses are applied to the corresponding gate line, the previous stage, and the next stage of a liquid crystal panel to prevent or minimize distortion of the scan pulses.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register, comprising:
   a plurality of stages dependently connected to each other, wherein each stage is configured to independently generate first and second scan pulses such that the first scan pulse is simultaneously applied to a previous stage and to a gate line corresponding to the stage of a liquid crystal panel, and the second scan pulse is applied to a next stage, and
   wherein each stage includes:
   a node controller configured to control charging/discharging operations of first and second nodes;
   a first output unit configured to select one of the first scan pulse and a ground voltage signal according to states of the first and second nodes and configured to transmit the selected signal to the corresponding gate line and to the previous stage simultaneously; and
   a second output unit configured to select one of the second scan pulse and the ground voltage according to the states of the first and second nodes and configured to transmit the selected signal to the next stage,
   wherein the node controller includes:
   a first switching element configured to charge the first node in response to a start pulse or in response to the second scan pulse generated from the second output unit of the previous stage;
   a second switching element configured to discharge the second node in response to the start pulse or in response to the second scan pulse generated from the second output unit of the previous stage;
   a third switching element configured to charge the second node in response to a clock pulse delayed by two pulse widths compared with the second scan pulse received from the previous stage; and
   a fourth switching element configured to discharge the first node when the second node is charged.

2. The shift register according to claim 1, wherein the node controller further includes:

a fifth switching element configured to discharge the second node when the first node is charged; and a sixth switching element configured to discharge the second node in response to the first scan pulse generated from the first output unit of the next stage.

3. The shift register according to claim 1, wherein the first scan pulse generated from the first output unit has same phase and magnitude as those of the second scan pulse generated from the second output unit.

4. The shift register according to claim 1, wherein the first output unit includes:

a pull-up drive configured to transmit the first scan pulse to the corresponding gate line and to the previous stage when the first node is charged; and a pull-down drive configured to transmit the ground voltage to the corresponding gate line and to the previous stage when the second node is charged.

5. The shift register according to claim 4, wherein the pull-up drive of the first output unit includes:

a seventh switching element configured to output the first scan pulse when the first node is charged and bootstrap-amplified by a clock pulse delayed by a single pulse width compared with the start pulse (SP) or the second scan pulse generated from the previous stage.

6. The shift register according to claim 4, wherein the pull-down drive of the first output unit includes:

an eighth switching element configured to output the ground voltage when the second node is charged.

7. The shift register according to claim 6, wherein a channel width of the eighth switching element is larger than that of the seventh switching element.

8. The shift register according to claim 1, wherein the second output unit includes:

a pull-up drive configured to transmit the second scan pulse to the next stage when the first node is charged; and a pull-down drive configured to transmit the ground voltage to the next stage when the second node is charged.

9. The shift register according to claim 8, wherein the pull-up drive of the second output unit includes:

a ninth switching element configured to output the second scan pulse when the first node is charged and bootstrap-amplified by a clock pulse delayed by a single pulse width compared with the start pulse (SP) or the second scan pulse generated from the previous stage.

10. The shift register according to claim 8, wherein the pull-down drive of the second output unit includes:

a tenth switching element configured to output the ground voltage when the second node is charged.

11. The shift register according to claim 10, wherein a channel width of the tenth switching element is larger than that of the ninth switching element.

12. The shift register according to claim 1, wherein a ratio of a channel width of a pull-up switching element to the pull-down switching element of the first output unit is higher a ratio of a channel width of a pull-up switching element to the pull-down switching element of the second output unit.

13. The shift register according to claim 1, further comprising:

a dummy stage for transmitting a scan pulse or a ground voltage to a last stage of the plurality of stages.

14. The shift register according to claim 13, wherein the dummy stage includes:

a single output unit for outputting the scan pulse or the ground voltage.

* * * * *